United States Patent [19]

Nishizawa

[11] Patent Number: 4,814,843
[45] Date of Patent: * Mar. 21, 1989

[54] CHARGE TRANSFER DEVICE WITH PN JUNCTION GATES

[75] Inventor: Jun-ichi Nishizawa, Sendai, Japan

[73] Assignee: Zaidan Hojin Handotai Kenkyu Shinkokai, Sendai, Japan

[*] Notice: The portion of the term of this patent subsequent to Nov. 10, 1998 has been disclaimed.

[21] Appl. No.: 933,343

[22] Filed: Nov. 19, 1986

Related U.S. Application Data

[63] Continuation of Ser. No. 716,617, Mar. 28, 1985, abandoned, which is a continuation of Ser. No. 637,706, Aug. 6, 1984, abandoned, which is a continuation of Ser. No. 239,472, Mar. 2, 1981, abandoned, which is a continuation of Ser. No. 51,201, Jun. 22, 1979, Pat. No. 4,300,151.

[30] Foreign Application Priority Data

Jul. 19, 1978 [JP] Japan ................................ 53-88868

[51] Int. Cl.$^4$ .................... H01L 29/78; H01L 27/14; H01L 31/00; G11C 19/28
[52] U.S. Cl. ........................................ 357/24; 357/22; 357/30; 377/68
[58] Field of Search ................. 357/24, 30; 377/57–63

[56] References Cited

U.S. PATENT DOCUMENTS

| | | | |
|---|---|---|---|
| 3,789,267 | 1/1974 | Krambeck et al. | 357/24 R |
| 3,825,996 | 7/1974 | Barron et al. | 357/24 M |
| 3,856,989 | 12/1974 | Weimer | 357/24 LR |
| 4,012,759 | 3/1977 | Esser | 357/24 M |
| 4,032,952 | 6/1977 | Ohba et al. | 357/24 M |
| 4,151,539 | 4/1979 | Barron et al. | 357/24 M |
| 4,157,558 | 6/1979 | Weckler | 357/24 R |
| 4,300,151 | 11/1981 | Nishizawa | 357/24 M |
| 4,378,629 | 4/1983 | Bozler et al. | 357/15 |

OTHER PUBLICATIONS

Sequin et al., *Charge Transfer Devices* Academic Press, N.Y. (1975).

*Primary Examiner*—Gene M. Munson
*Attorney, Agent, or Firm*—Cushman, Darby & Cushman

[57] ABSTRACT

A plurality of static induction transistors capable of establishing a controllable potential barrier for charge carriers in the channel region between the source and the drain under the influence of the potentials of the gate and the drain connected in series and integrated in a semiconductor chip to constitute a charge transfer train. The drain of one static induction transistor and the source of the next adjacent static induction transistor are integrated in common into a charge storage region. An insulated electrode is provided on each charge storage region to control the potential thereof. The charge transfer train can be driven by 4-phase, 3-phase or 2-phase signals. The gate electrode and the drain electrode for each transistor may be integrated to form directional 2-phase charge transfer train. Image pick up device of very high operation speed can be materialized with the above charge transfer train.

2 Claims, 6 Drawing Sheets

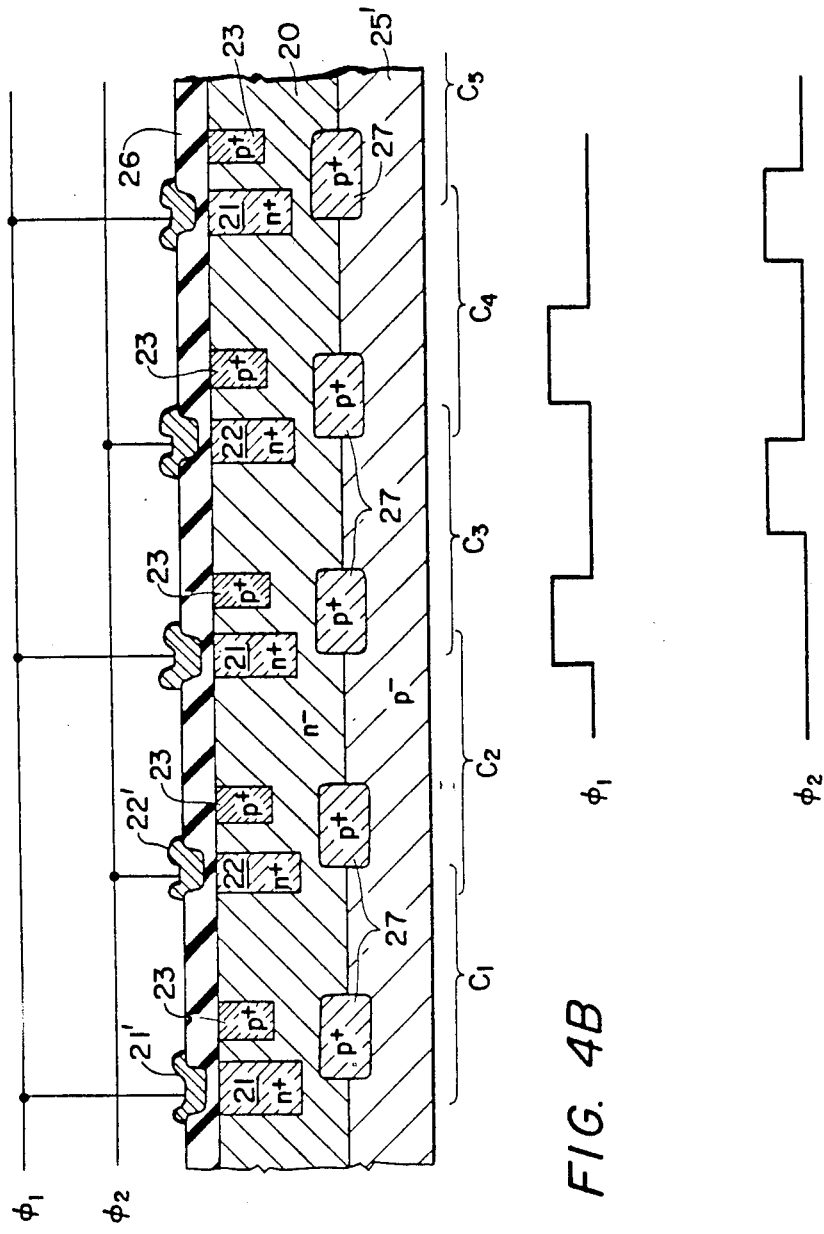

CHARGE TRANSFER DEVICE WITH PN JUNCTION GATES

This is a continuation of application Ser. No. 716,617, filed Mar. 28, 1985, which was abandoned upon the filing hereof, which in turn is a continuation of Ser. No. 637,706 filed Aug. 6, 1984, which is a continuation of Ser. No. 239,472 filed Mar. 2, 1981, which is a continuation of Ser. No. 051,201 filed June 22, 1979, now U.S. Pat. No. 4,300,151 Ser. No. 637,706 and Ser. No. 239,472 are now abandoned.

BACKGROUND OF THE INVENTION (a) Field of the invention

The present invention relates to a semiconductor charge transfer device, and more particularly it pertains to a charge transfer device utilizing the principles of static induction transistor.

(b) Background of the invention

Charge transfer devices may be divided into the following two types: minority carrier transfer type and majority carrier transfer type.

Known minority carrier transfer type charge transfer devices have the drawback that they tend to ignore transfer of stored charge (transfer loss) as viewed from the principles of such devices.

Also, in known carrier transfer, there is introduced in some part of the transfer process a movement of minority carriers due to diffusion. Such introduction determines the upper limit of the speed of transfer. Moreover, minority carriers usually move in the vicinity of the interface between the semiconductor body and the insulating film. Therefore, these minority carriers are susceptible to the influence of the surface such as surface mobility and trap. In order to overcome these drawback and inconveniences, there has been proposed majority carrier transfer type charge coupled devices. In majority carrier transfer type charge coupled devices, there is produced a depletion layer around the charge-storing region, and the transfer of those majority carriers is performed by wrapping the charge carriers with this depletion layer. Since this transfer is of the type, to expel charge carriers by the repulsive field, there exists a problem in the efficiency of transfer.

The static induction transistor (SIT) proposed by the present inventor is a transistor designed to be operative so that the travel of the charge carriers which flow from the source region to the drain region is controlled by a potential barrier which, in turn, is controlled by both the gate potential and the drain potential. This potential barrier is formed by a saddle portion of the potential distribution, and the charge carriers flow in the transverse direction along the lowest portion of the saddle portion (low potential region) after passing the extremal point located intermediary in the saddle portion. By selecting the impurity concentration of the channel region at a low value so as to enable the channel region to become easily depleted and to produce a saddle-shaped potential distribution without leaving an elongated neutral region, and by reducing the distance from the source region to the saddle portion (intrinsic gate), a non-saturating type current-voltage characteristic is materialized. The gate structure of SIT has, as its main object, to transmit a potential to the channel region, and may be of the junction type, Schottky type or insulated-electrode type. The conductivity type of the channel region may be the same with that of the source region, or it may have a conductivity type opposite to that of the source region. In either case, a voltage applied between the source region and the drain region has a tendency to produce a monotonically decreasing potential gradient between the source region and the drain region and to allow a flow of current. Such current flow is controlled by modulating the intermediately-located potential distribution by a source-to-gate voltage. In case the channel region has a conductivity type same as that of the source region, a high potential portion (potential barrier) is produced within the channel region by a total gate potential including the build-in potential. Namely, the total gate potential pulls up the potential of the channel region. This potential barrier is controlled by a gate voltage and a drain voltage. The length of this potential barrier in the source-to-drain direction is arranged to be sufficiently small so as to let those carriers which have passed over this potential barrier flow quickly toward the drain region.

In case the channel region has a conductivity type opposite to the source region, the length of the channel region is arranged to be small (short-channel) and the impurity concentration of the channel region is arranged to be low to ensure that the channel region located between the source region and the drain region is rendered to the punching-through stage, i.e. depleted, by the application of a drain voltage so that the potential barrier located in the foreground of the source due to the pn junction can be controlled by the application of a drain voltage, and concurrently therewith the width of this channel region is selected so that the influence of the gate voltage applied will extend throughout the overall width of the channel region and will control the height of the potential barrier.

Because of the fact that, in the main operative state, the major portion of the channel region is depleted, the operation principles of the device wherein the channel region has a conductivity type opposite to that of the source region is substantially the same as that of the device wherein the channel region has a conductivity type same as that of the source region, except that the space charge has a polarity identical with or different from that of the charge carriers which constitute a current.

SUMMARY OF THE INVENTION

An object of the present invention is to provide a charge transfer device having a simple structure and a high transfer efficiency and transfer speed, utilizing the principles of a static induction transistor.

Another object of the present invention is to provide an image pick-up device using the aforesaid charge transfer device.

By connecting together a plurality of static induction transistors in series, and by combining together the source region of one transistor with the drain region of an adjacent transistor to form one common region, there is formed a charge transfer train. The resultant combined source-drain region forms a main electrode which serves as a charge storage region, and the charge transfer between adjacent two main electrodes is performed by controlling the potentials of these two main electrodes and the potential barrier developed within the channel region between these two main electrodes. The height of this potential barrier is controlled by the potential of the gate structure which is provided adjacent to this channel region and also by the potential between the adjacently located main electrode regions.

In the conducting state of the device, most of the channel region is given a potential gradient and charge carriers move, in drift motion, within the semiconductor bulk, so that the operating speed of the device is very high. Moreover, in the non-conducting state, the main electrode region wherein a charge is stored is surrounded by the potential barrier, so that there is very little leakage of the electric charge. It is desirable that the gate structure of a static induction transistor is made as small as possible, so that the gate capacitance can be made small. Accordingly, the area required for a single unit cell can be made small, so that the packing density can be elevated.

There are two types of operations in the charge transfer devices, the accumulation mode and the depletion mode. The accumulation mode which is designed to accumulate mobile charge carriers, and the depletion mode designed to expel mobile charge carriers from a main electrode. In the depletion mode, the amount of shortage of mobile charge carriers represents a signal charge. In this depletion mode, the main electrode which has accumulated signal charge is subjected to a reverse bias, so that the retention of this signal charge becomes improved.

These as well as other objects, features and advantages of the present invention will become apparent from the detailed explanation of the preferred embodiments when taken in conjunction with the accompanying drawings.

BRIEF DESCRIPTION OF THE DRAWINGS

FIGS. 4A and 4B are a schematic cross-sentional view of a 2-phase control type charge transfer device and a drive signal timing chart for driving same according to further embodiment of the present invention.

DETAILED DESCRIPTION OF THE PREFERRED EMBODIMENTS

Figure 1A:
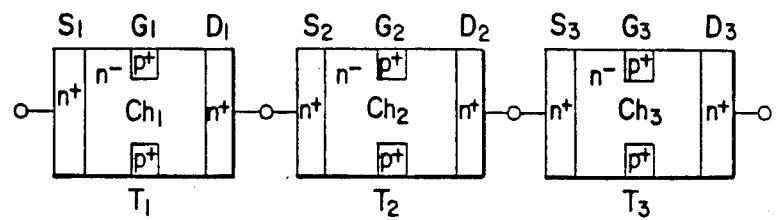
Figs. 1A to 1D are diagrammatic illustration for explaining the principles of the present invention.

Firstly, by referring to Figs. 1A to 1C, the principles of the present invention will be explained hereunder. FIG. 1A shows a basic model of one charge transfer train wherein a plurality of depletion-mode static induction transistors $T_1$, $T_2$, $T_3$, ... are connected together in series. Each of these transistors is shown as being an n-channel junction SIT. Explanation will be made by giving reference to the first transistor $T_1$. The $p^+n^-$ junction between the gate $G_1$ and the channel $Ch_1$ has its built-in potential corresponding to the impurity, concentrations of these respective regions. Let us now assume that the width and the impurity concentration of the channel $Ch_1$ are selected to ensure that the depletion layer which is produced by said built-in potential extends across the channel $Ch_1$ and produces a potential barrier to thereby electrically isolate the source region $S_1$ and the drain region $D_1$. Arrangement is also may so that the distance from the source region up to the potential barrier is selected to be sufficiently small, and that, accordingly the resistance between these two regions is made sufficiently small. By the application of a forward bias voltage to the gate $G_1$, the depletion layer extending from the gate region $G_1$ shrinks, so that the potential barrier disappears, and accordingly there is established an electrical connection between the source region $S_1$ and the drain region $D_1$. The second transistor $T_2$ and the third transistor $T_3$ each has a structure similar to that of the first transistor $T_1$. The drain region $D_1$ of the first transistor $T_1$ is directly connected to the source region $S_2$ of the adjacent transistor $T_2$. In the similar way, the drain region of the second transistor $T_2$ is directly connected to the source region $S_3$ of the third transistor $T_3$.

Let us now suppose that an excessive amount of electrons is being stored in the source region $S_1$ of the first transistor $T_1$. By appropriately selecting the potentials of the gate region $G_1$ and the drain region $D_1$ (that is, providing a positive potential), the first transistor is rendered conductive, and those electrons which have been stored in the source region $S_1$ will be accelerated to move toward the drain region $D_1$. Since the drain region $D_1$ is electrically connected to the source region $S_2$, the above-said phenomenon will mean that electrons are now stored in this composite region. When the gate region $G_1$ is rendered back to zero potential after the transfer of electrons stated above, the channel $Ch_1$ becomes pinched off, so that electric charge will no longer return to the source region $S_1$. Next, by rendering the potentials of the gate region $G_2$ and the drain region $D_2$ to positive, the drain region $D_2$. In this way, electric charge can be transferred in succession. This is the accumulation mode operation.

Let us now suppose that the drain region $D_3$ is short of electrons, i.e. this region is charged positive. When the source region $S_3$ is set at a predetermined potential (zero) and when a predetermined forward bias potential is applied to the gate region $G_3$, the channel $Ch_3$ is rendered conductive, so that electrons will be allowed to flow from the source region $S_3$ into the drain region $D_3$. When, due to those electrons having flown in, the drain region $D_3$ becomes neutral, the source region $S_3$ will, correspondingly, be charged positive. Next, by forwardly biasing the gate region $G_2$, causing the channel $Ch_2$ to become conductive, electrons will flow from the source region $S_2$ into the drain region $D_2$, so that the stored positive electric charge is neutralized. Then, the source region $S_2$ will become positively charged corresponding to those electrons which have flown out. In this way, it is possible to transfer the state of shortage of mobile charge carriers successively to the adjacently located transistor. This is the depletion-mode operation. In the accumulation mode, the storage region is forward biased due to the accumulation of signal electric charge, in contrast to the depletion mode in which the storage region is reversely biased. It is to be noted that each of the depletion-mode SIT and the enhancement-mode SIT has these two operation modes.

Figure 1B:
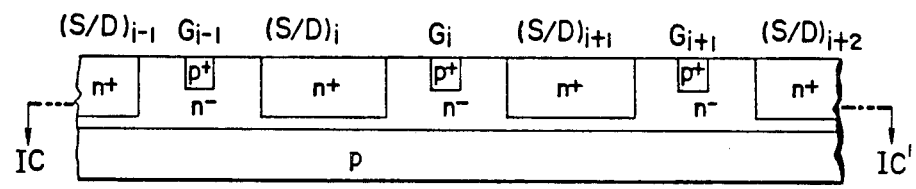

FIG. 1B shows an example in which the arrangement shown in FIG. 1A is integrated. It should be understood that the source regions of the respective transistors and the drain regions of their adjacently located transistors do not need to be separated, so that these two kinds of regions are formed as a common region (S/D) It should be understood also that, from the aspect of manufacturing technique, the gate regions are provided only on the upper side of the chip, and a back-biasing p type region is provided on the lower side.

Figure 1C:
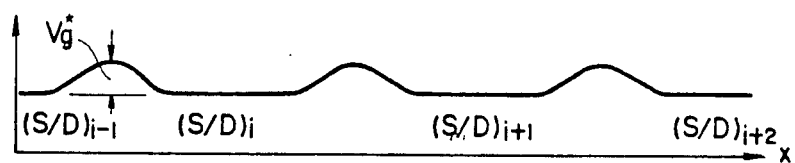
Figure 2A:
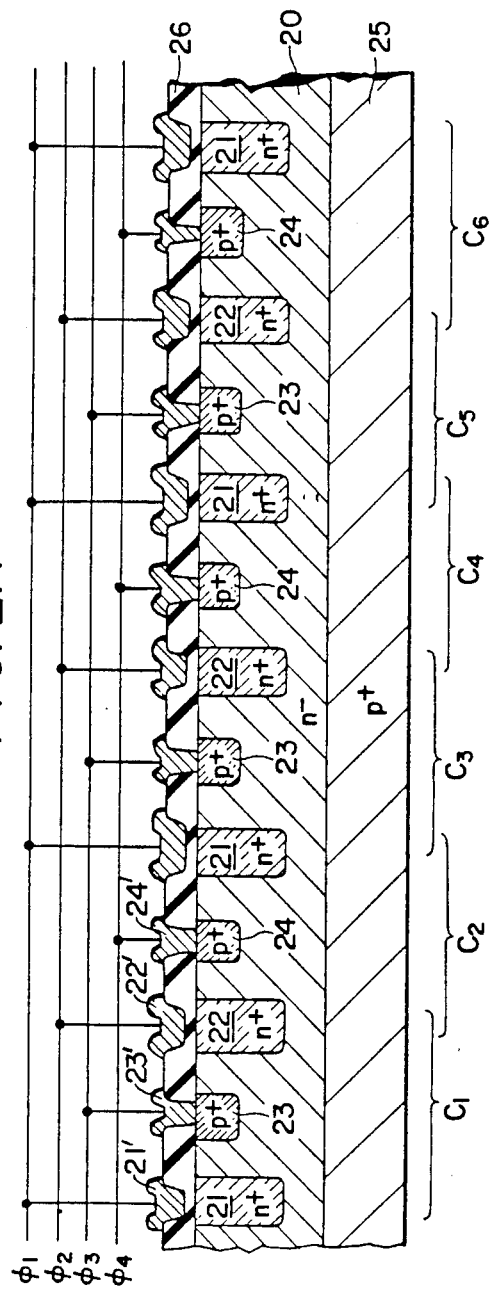
FIGS. 2A and 2B are a schematic cross-sectional view of a 4-phase control type charge transfer device, and a drive signal timing chart for driving same according to an embodiment of the present invention, respectively.
Figure 2B:
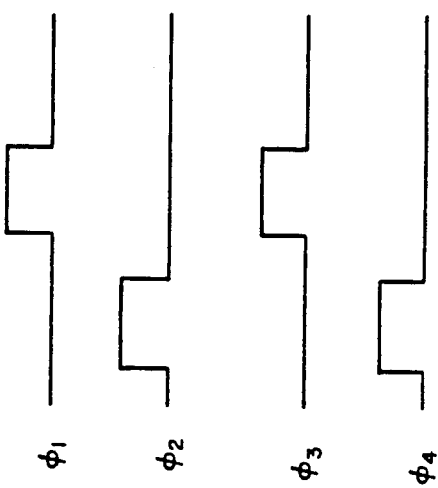

FIG. 1C shows an example of potential distribution along the line IC-IC' in the structure shown in FIG. 2B. Let us here assume that the respective storage regions (S/D) and the respective gate regions G are held at a common potential. The respective storage regions (S/D) have a given common potential, and a potential barrier $V_g^*$ is formed within the channel region by the depletion layer extending from the respective gate regions G. Where this potential barrier $V_g^*$ is sufficiently greater than the thermal energy, the respective storage regions are electrically isolated from each other. Where the storage region stores electric charge in the accumulation mode, the potential of such storage region rises, so that this storage region will be rendered to a forward-bias state for its adjacent channel region. At such time, the potential barrier $V_g^*$ decreases. Accordingly, it is necessity to design a device to ensure that an electric charge be maintained even under the state in which the potential barrier $V_g^*$ is decreased.

In case electric charge is stored in the depletion mode, the region is reverse biased, and the potential barrier $V_g^*$ increases. It is necessary to set a control voltage to cause disappearance of this increased potential barrier.

Explanation has been made with respect to an n-channel junction SIT. It will be obvious to those skilled in the art to prepare a charge transfer train with a p-channel junction SIT by reversing the conductivity types of all the concerned regions. Also, it is only necessary for the gate structure to be capable of controlling the potential of the channel region, so that it will be readily understood also that the gate structure may be Schottky gate or insulated gate structure.

Figure 1D:
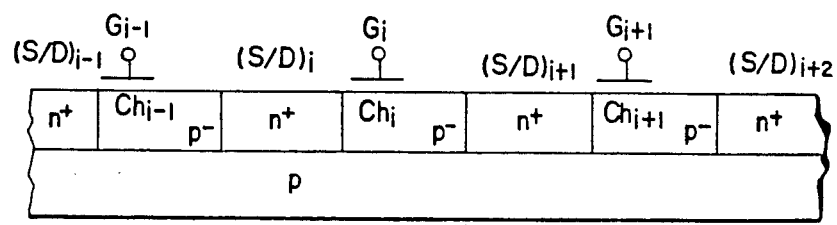

In the instance wherein the conductivity type of the channel region is made opposite to the conductivity type of the source region, the basic principles of the present invention do no differ from these stated above. In FIG. 1D, there is shown a charge transfer train in which an enhancement-mode insulated-gate SIT is employed. An $n^+$ type main electrode region (S/D) and a $p^-$ type channel region Ch are arranged in alternate fashion on a p type region. An insulated gate G is formed on the $p^-$ type channel region. Let us now assume that the $n^+$ type main electrode region $(S/D)_i$ is held at zero potential, and that a positive voltage is applied to its adjacent $n^+$ type main electrode region $(S/D)_{i+1}$. Since the $p^-$ type channel region $Ch_i$ and the $n^+$ type main electrode region $(S/D)_{i+1}$ reverse biased, there extends a depletion layer from the main electrode region $(S/D)_{i+1}$ into the $p^-$ channel region $Ch_i$. When this depletion layer reaches the main electrode region $(S/D)_i$, the potential barrier which is formed by the junction between the $n^+$ type main electrode region $(S/D)_i$ and the $p^-$ type channel region $Ch_i$ begins to become smaller (punching-through). As this potential barrier decreases, electrons are injected from the $n^+$ type main electrode region $(S/D)_i$ into the channel region $Ch_i$, so that a current is allowed to flow. On the other hand, in the channel region which is located in the vicinity of the gate electrode $G_i$, the potential thereof is determined almost entirely by the potential of the gate electrode. As the portion goes farther away from the gate electrode, the effect of the gate potential becomes smaller. Accordingly, when the effect of the voltage of the main electrode has overcome the effect of the gate potential, and causes a decrease in the potential barrier, a current is allowed to flow. This accumulation mode SIT is identical with the aforesaid depletion mode SIT in that the potential barrier is controlled by both the gate voltage and the main electrode voltage. It should be noted, however, that when a positive gate voltage having a value above a certain level is applied to this accumulation mode SIT, an is produced below the gate electrode in the $p^-$ type region, so that a resistive conduction can also be produced.

Arrangement is made so that the p type region which is provided at the bottom of the chip has an impurity concentration sufficiently higher than that of the $p^-$ type channel region to substantially prevent a depletion layer from entering into this p type region. This p type region, needless to say, may be comprised of a $p^+$ type region, or it may be an insulated substrate.

Hereunder, those exemplary embodiments of the present invention will be explained in more detail with respect to charge transfer devices using an n-channel junction SIT.

FIG. 2A shows a charge transfer device according to an embodiment of the present invention. This device is controlled by a 4-phase signal. Along the surface of a high resistivity $n^-$ type region 20 which is formed on top of a $p^+$ type substrate 25, provided $n^+$ type regions 21 and 22 and $p^+$ type regions 23 and 24 in alternate fashion. In order to control the potentials of the n type regions $n^+$ 21 and 22, there are conductive electrodes 21' and 22' respectively are provided on the surfaces of these $n^+$ type regions via an insulating layer 16. Conductive and ohmic electrodes 23' and 24' are provided for the $p^+$ type regions 23 and 24, respectively. The $p^+$ type substrate 25 may be used is an electrically floated state, or a predetermined potential may be applied hereto. Those electrodes 21' which are provided on the respective $n^+$ type regions 21 are wired in-common, so that they are supplied with a signal voltage $\phi_1$. Those electrodes 22' which are provided on the respective $n^+$ type regions 22 are wired in common and are provided with a signal voltage $\phi_2$. Also, the electrodes 23' which are provided on the respective $p^+$ type regions 23 are wired in common, and are supplied with a signal potential $\phi_3$. Those electrodes 24' which are provided on the respective $p^+$ type regions 24 are wired in common, and are supplied with a signal potential $\phi_4$. Alternatively, these common wirings each may be formed with a continuous conductive electrode. The respective unit cells within a transfer train are indicated by $C_i$. Designing of the device is made so that, in each cell, the channel is being closed by a potential barrier in the state that no particular potential is applied.

The operation of the device in the depletion mode will be explained hereunder. Let us now assume that a positive charge (shortage of electrons) is stored in the $n^+$ type region 22 which is located on the left side of the cell $C_2$ (second cell from extreme left in the drawing). A 4-phase driving pulse which is used in the transfer of positive charge to the $n^+$ type region 21 located on the right side of said cell $C_2$ is shown in FIG. 2B. A positive pulse is applied to line $\phi_4$ which will cause the opening of the channel, and at the same time a positive voltage is applied to line $\phi_2$. Whereupon, the potential of the n+ type region 22 rises, and the channel is opened. Therefore, electrons are allowed to flow from the n+ type region 21 which is located on the right side toward the n+ type region 22 which is located on the left side of this cell. The n+ which electrons have flown is rendered to a neutral type region 22 into state, whereas the n+ type region 21 from which electrons have flown out is charged positive. That is, the positive electric charge has been transferred toward the right side of this cell. The heights and the widths of the respective pulses are selected so that the stored electric charge is transferred perfectly. Next, the positive electric charge which has been transferred to the n+ type region 21 located on the right side of the cell $C_2$ (meaning the left side of the cell $C_3$) is transferred to the n+ type region 22 which is located on the right side of the cell $C_3$. To this end, a positive pulse is applied to $\phi_3$ to open the channel, and a positive voltage is applied to $\phi_1$. Whereupon, a process similar to that stated above takes place in the cell $C_3$, so that a positive electric charge is transferred to the n+ type region 22 which is located on the right side of the cell $C_3$. At such time, $\phi_4$ is held at zero potential. Accordingly, the channel of the cell $C_2$ remains in its closed state, so that the positive electric charge is not returned toward the left side. It should be understood that, by rearranging the signal voltage $\phi_1$, $\phi_2$, $\phi_3$ and $\phi_4$, it is possible to transfer the positive voltage toward the left side. It should be noted, here, that the driving system shown in FIGS. 2A and 2B is unfailingly certain, but that the controlling signals are 4-phased, so that the operation is complicated.

Figure 3A:
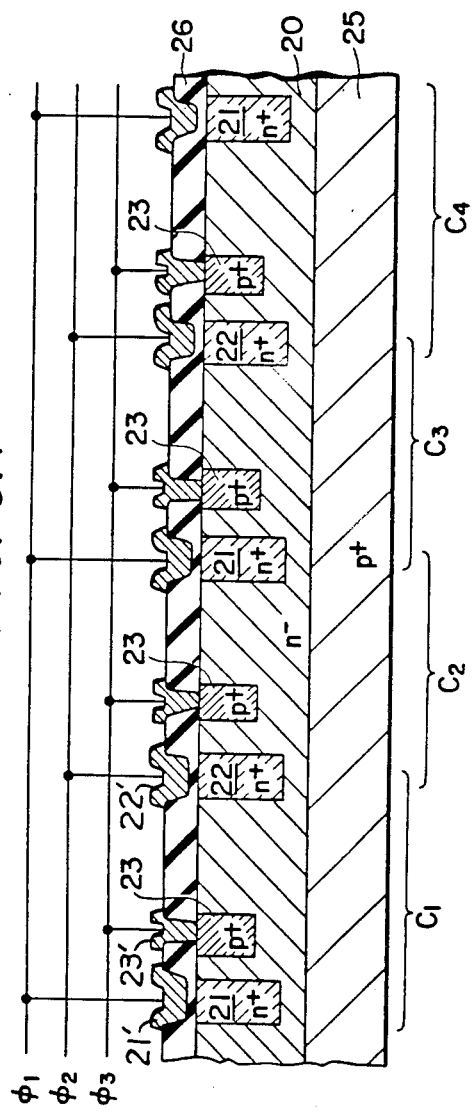
FIGS. 3A and 3B are a schematic cross-sentional view of a 3-phase control type charge transfer device, and a drive signal timing chart for driving same according to another embodiment of the present invention.
Figure 3B:
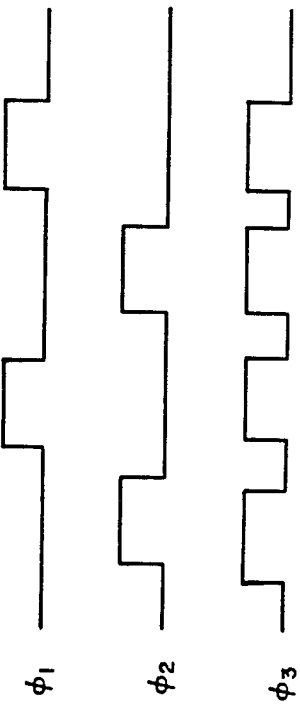

An example which allows a 3-phase driving operation is shown in FIGS. 3A and 3B. In this example each of the p+ type regions 23 is provided closer to one of the neighboring n+ type storage regions, and an electrode 23' provided thereon is wired in common for all of the p+ type regions 23. Since, in this example, the signal which is supplied to the control electrodes is of a single phase, a 3-phase control is made feasible. It is the position of the p+ type region 23 within each cell that determines the direction of charge transfer.

Let us now assume that a positive electric charge (shortage of electrons) is stored in the n+ type region 22 located on the left side within the cell $C_2$. As shown in FIG. 3B, when a positive voltage is applied to $\phi_3$, the potentials of the respective control electrodes 23 rise to a certain extent, and accordingly the potential barrier is lowered. At the same time therewith, a positive voltage is applied to $\phi_2$ also, as shown in FIG. 2B. Whereupon, the potential of the n+ type region 22 for electrons is lowered, and owing to this effect, the potential barrier which has till then been formed within the cell $C_2$ by the potential of the p+ type region 23 disappears. Within the cell $C_1$, the p+ type region 23 is separated away from the n+ type region 22. Accordingly, the effect of control of the potential barrier by the potential of the n+ type region 22 is minor, and therefore the potential barrier within the cell $C_1$ does not disappear. As a result, electrons are allowed to flow from the n+ type region 21 in cell $C_2$ into the n+ type region 22, so that the positive electric charge in the n+ type region 22 is neutralized. The n+ type region 21 is positively charged correspondingly to those electrons which have flown out. In this way, the positive electric charge is transferred from the n+ type region 22 which is located on the left side of the cell $C_2$ into the n+ type region 21 which is located on the right side.

Next, a positive voltage is applied to $\phi_3$, and concurrently therewith a positive voltage is applied to $\phi_1$. Whereupon, a positive electric charge is transferred from the n+ type region 21 located on the left side of the cell $C_3$ into the n+ type region 22 which is located on the right side of this cell. In this way, it is possible to transfer electric charge in a way similar to that described in connection with FIGS. 2A and 2B. It should be noted, however, that in this example, the direction in which the positive electric charge is transferred is fixed, and also that the region corresponding to the portion located between the gate and the source is prolonged, so that the operating speed is somewhat delayed. It is desirable that the number of driving signals for the charge transfer device is as small as possible. The minimum number of driving signals is represented by 2-phase driving. A 2-phase driving system is shown in FIGS. 4A and 4B. In the vicinity of the boundary between a p− type substrate 25' and an n− type high resistivity layer 20 which is formed on this substrate, there are provided p+ type embedded regions 27. Each of the gate regions 23 is provided closer to one of its neighboring n+ type regions to perform directional charge transfer in a way similar to that of the example shown in FIG. 3A. In this example, by the provision of the p+ type embedded regions 27, the position of the potential barrier for controlling the flow of current is formed much closer to one of the neighboring n+ type regions than in the preceding example. In the instant example, the gate regions 23 are each arranged to be supplied with a floating potential or a constant certain potential. The p+ type regions 27 also may have a floating potential, or they each may be partly exposed at the surface of the semiconductor body to be provided with an electrode, so that they may be held at a predetermined certain constant potential. In any way, no signal voltage which varies with time is supplied to either the control region 23 or 27.

Let us now suppose that a positive electric charge is stored in the n+ type region 21 (located on the extreme left side in the drawing). When a positive voltage is applied to $\phi_1$, electrons will flow from the n+ type region 22 located on the right side of the region 21, and the positive electric charge will be transferred toward the right side thereof. On the other hand, when a positive voltage is applied to $\phi_2$, the positive electric charge will be transferred further to the n+ type region 21 located farther on the right side. This example also has a drawback similar to that of the example shown in FIG. 3A, and the operating speed is slightly delayed.

The operations of the embodiments have been explained with respect to the depletion mode. It will be evident to those skilled in the art that they are capable of operating in the accumulation mode also.

Figure 5:
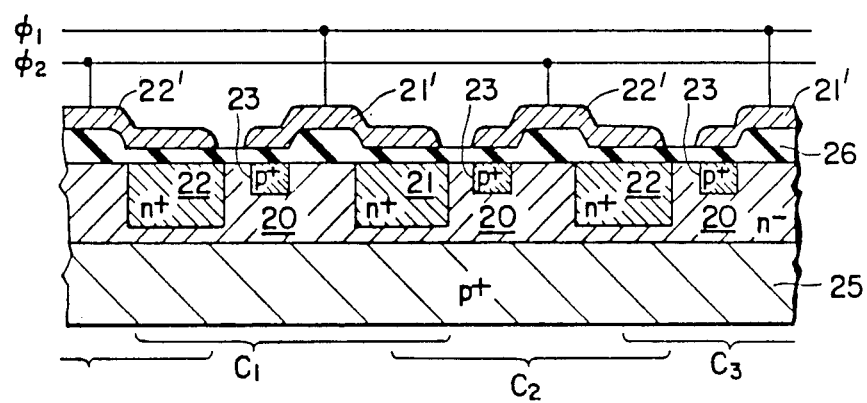
FIG. 5 is a schematic cross-sentional view of another 2phase control type charge transfer device according to another embodiment of the present invention.

Next, an embodiment which is capable of performing operation with a 2-phase driving signal and which has a high operating speed is shown in FIG. 5. In this embodiment, in addition to the insulated electrode on the charge storage region, an insulated electrode is also provided also for the channel control region, and a common voltage signal is applied to a pair of insulated gate and drain electrodes.

On top of a p type substrate 25, there is formed an n− type epitaxial layer 20, and n+ type regions and 22 and p+ type regions 23 are formed within this n− type epitaxial layer 20, thereby forming the respective cells $C_1$, $C_2$, $C_3$, ... of a charge transfer train. On top of the $n^-$ type layer 20 is formed an insulating film 26 such as an $SiO_2$ or an $Si_3N_4$ film. On this insulating film are provided electrodes 21' and 22'.

Each electrode 21' or 22' is formed on one of the $n^+$ type regions 21 and 22 and on one of the $p^+$ type regions 23 so as to bridge these two regions. Therefore, it is possible to control both of the $n^+$ type region and the $p^+$ type region at the same time. It will be noted that that portion of the insulating film 26 located on the $n^-$ type region 20 has a greater thickness, and that, accordingly, the effect of the electrode 21' or 22' exerted onto the $n^-$ type region 20 is minimized. The thickness of the insulating layer 26 may be equally small on the $n^+$ type region 21 or 22 and on $p^+$ type region 23. It should be understood, however, that the insulating film 26 may have different thicknesses on these regions, to provide difference in the effect exerted onto the $p^+$ type region 23 and the effect exerted onto the $n^+$ type region In this instant example, electrons are allowed to flow from the left side toward the right side in each cell. Therefore, in order to enhance the control efficiency and to elevate the operating speed, each of the $p^+$ type regions 23 is formed closer toward the left side in the respective channels. It should be noted, however, that the role of the $p^+$ type regions above all, to render the channel pinched off. Accordingly, in order to enhance the packing density, the $p^+$ type region 23 may be disposed in the central part of the channel region 20 to minimize as much as possible the size of the respective cells.

The operation of the device will hereunder be explained with respect to the accumulation mode. Let us suppose here that a zero potential is supplied to $\phi_1$, and a positive potential is applied to $\phi_2$, and that electrons are stored in the $n^+$ type region 22 of the cell $C_1$. When the potential of $\phi_2$ is returned to zero, and when the potential of $\phi_1$ is rendered positive, the $p^+$ type region 23 is supplied with a forward bias voltage, and the channel region 20 in cell $C_1$ is rendered conductive. At the same time therewith, a positive potential is supplied also to the $n^+$ type region 21. Accordingly, those electrons which have been stored in the $n^+$ type region 22 will pass through the channel region 20 and will move to the $n^+$ type region 21. Next, when the potential of $\phi_1$ is returned again to zero, and when the potential of $\phi_2$ is rendered positive, the channel region 20 of cell $C_1$ becomes nonconductive, and the channel region 20 of cell $C_2$ becomes conductive. Since a positive potential is given to the $n^+$ type region 22 of cell $C_2$ also, those electrons stored in the $n^+$ type region 21 will move to the $n^+$ type region 22. In this way, by the use of 2-phase control signal, it is possible to perform the transfer of electric charge in succession. The drain electrode should be insulated, but the gate electrode may not necessarily be insulated.

As stated above, this embodiment utilizes 2-phase driving. Yet, the device exhibits an effect substantially similar to that of the 4-phase driving example shown in FIGS. 2A and 2B. This is because that an effect similar to that provided by $\phi_1$ and $\phi_3$ (or $\phi_2$ and $\phi_4$) or FIGS. 2A and 2B is provided by $\phi_1$ (or $\phi_2$) of FIG. 5. It will be evident to those skilled in the art that this embodiment can be similarly effectively used in a depletion-mode operation as well.

In order that the channel region is unfailingly pinched off, the $p^+$ type substrate may be supplied with a predetermined negative voltage. This is especially true in the accumulation mode operation where a considerable amount of electrons may be stored in the $n^+$ storage, region. According the absolute value of the potential of this region may become considerable. The $n^+$ type storage region and the $p^+$ type substrate may then become forward biased, permitting a current to flow, and the storage of electrons may be degraded. In such case, reverse biasing of the substrate (in the structure shown in FIG. 5, application of negative voltage) is an indispensable condition.

In the embodiments stated above, when silicon is used as the semiconductor body, typical impurity concentrations of the respective regions are: about $10^{17} - 10^{21}$ $cm^{-3}$ for the $n^+$ type regions 21, 22; about $10^{17} - 10^{21}$ $cm^{-3}$ for the $p^+$ type regoins 23, 24; about $10^{12} - 10^{15}$ $cm^{-3}$ for the $n^-$ type region 20; and about $10^{13} - 10^{17}$ $cm^{-3}$ for the $p^-$ type region 25'. Typical thickness of the insulating layer provided on the high-impurity concentration region which constitutes a storage capacitance is about 100 Å–3000 Å. The thickness of the insulating layer on the heavily doped gate region is preferably larger than that on the storage region.

In those charge transfer devices which have been described above, the transfer of carriers is performed not by diffusion, but essentially by drift in an electric field. Accordingly, as compared with the charge transfer in known MOS-CCD which is performed by diffusion, it becomes easy to improve the transfer speed by one order or more. In contrast to known MOS-CCD which operates at a clock pulse of several MHz at the highest there can be materialized charge transfer devices which can operate by a clock pulse of several 10 MHz.

It will be readily understood by those skilled in the art that, by arranging, in a plurality of parallel rows on a substrate, one-dimensional transfer trains as described above, there is provided a two dimensional transfer device. These respective parallel trains may be isolated from each other by an insulating material or by recesses (cut-aways).

Those charge transfer devices described above can be used for various purposes like known charge transfer devices. Especially from the view-point that the aforementioned charge transfer devices are capable of performing a high-speed operation, these devices can be used effectively also in such field of technique in which desired performance cannot be provided by known charge transfer devices.

Next, referring to FIG. 6, an electric charge transfer type image pick-up device will be explained. In a manner similar way to FIG. 5, an $n^-$ type epitaxial layer 20, an insulating layer 26, and electrodes 21' and 22' are formed on a $p^+$ type substrate 25. In the $n^-$ type layer 20 are formed $n^+$ type regions 21 and 22 which reach the substrate 25, and also $p^+$ type gate regions 23, thereby forming the respective cells $C_1$, $C_2$, $C_3$, .... In this embodiment, recessed portions 51 and 52 are formed in the substrate 25 to provide light receiving portions. Above each of these light-receiving portions, the $p^+$ type substrate 25 and the $n^+$ type region 22 jointly constitute a photo-diode. Electrodes may be provided on those portions of the substrate 25 excluding the light-receiving portions.

Let us now assume that, either by reversely biasing the substrate, or by applying a positive potential to $\phi_1$ and $\phi_2$, a light is caused to impinge onto the light-receiving portions 51 and 52, respectively. Whereupon, among those electron-hole pairs which have been ionized by the incident light, electrons will flow into the n+ type region 22, and will flow into the p+ type substrate 25. A positive potential is also applied to $\phi_1$ to pinch off the channel region. Next, when the potential of $\phi_2$ is returned to a potential same as that of the substrate, the potential of the n+ type region 22 in which is stored an electric charge is elevated. Because of the positive potential of $\phi_1$, cells $C_1$ and $C_3$ are rendered to the conducting state, whereas the cell $C_2$ is rendered non-conductive. Accordingly, the electrons which have been stored in the n+ type region 22 passes through the channel regions within the conducting cells $C_1$ and $C_3$, and move toward the n+ type region 21 which is located on the right side of the cells $C_1$ and $C_3$. Then, by rendering $\phi_1$ to a potential same as that of the substrate, and by rendering $\phi_2$ to a positive potential, cells $C_1$, $C_3$, . . . will become non-conductive, whereas cells $C_2$, . . . will become conductive. Accordingly, those electrons which have been stored in the lefthand-side n+ type region 21 within the cell $C_2$ will be transferred to the righthand-side n+ type region 22 which is located farther on the right side of the region 21. By rendering $\phi_1$ and $\phi_2$ to a positive potential, in alternate fashion, as stated above, the electric charge will be transferred to the right side in succession. In the structure of FIG. 6, the n+ type region reaches the substrate. It should be understood, however, that this n+ type region does not necessarily reach the substrate, and that it may be separate therefrom. Also, the light-receiving recessed portion may be widened, so that light may be allowed to impinge also onto those areas around the n+ type region 22. It should be noted here that it is the region of the depletion layer which is formed by the reverse bias between the n+ type region and the substrate that acts effectively against the incident light. Therefore, in order to obtain a wide depletion layer, the impurity concentration of the substrate may be lowered, or there may be provided a high resistivity region to intervene between the n+ type region and the substrate.

Figure 6:
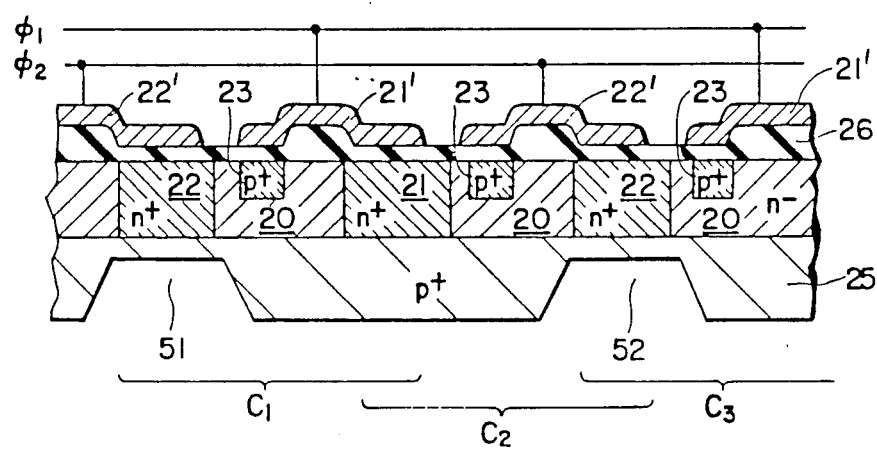
FIG. 6 is a schematic cross-sentional view of a 2-phase control type charge transfer image pick-up device according to another embodiment of the present invention.

In the embodiment of FIG. 6, it is desirable that the scanning time period be reduced to a negligible degree as compared with the light-receiving time, or to jointly employ a shutter means which is synchronized with both the light-receiving period of time and the transfer period of time.

As noted in known image pick-up devices, there a light-receiving frame may be provided separately, so that the stored electric charge is delivered from this light-receiving frame into a transfer frame, and image information is read out from this transfer frame. There is a necessity for the provision of transfer means in which electric charge is moved from the image frame to the transfer frame for each scanning of the image surface. However, because of the fact that light-receiving and transferring are carried out at separate sites, loss of time can be reduced.

Figure 7A:
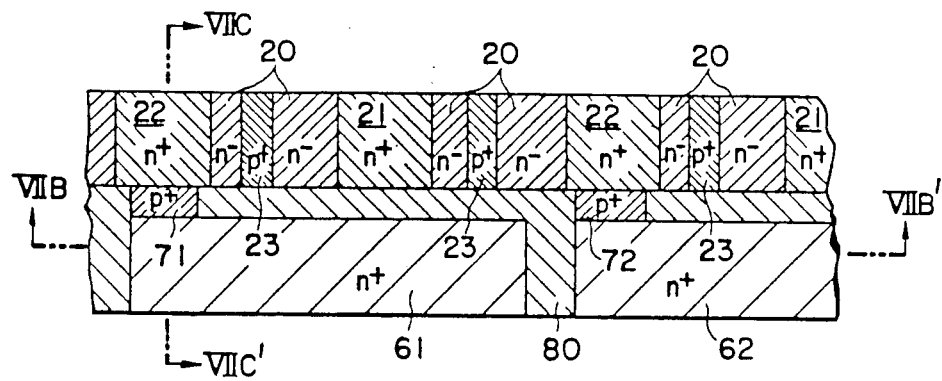
FIGS. 7A to 7C are schematic plan view and two schematic cross-sentional views of an image pick-up device according to another embodiment of the present invention.
Figure 7B:
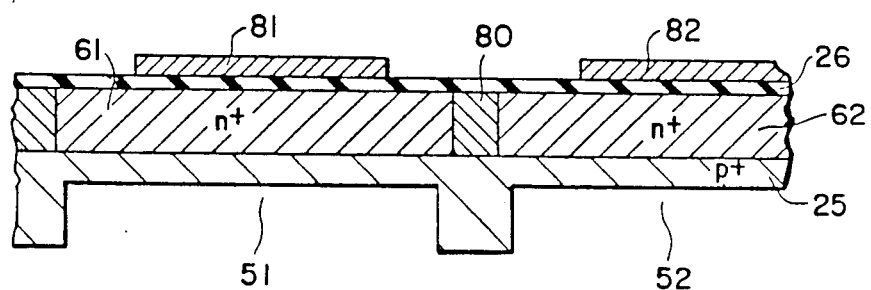
Figure 7C:
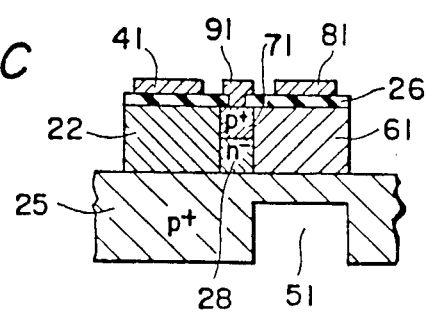

FIGS. 7A to 7C show schematically an embodiment of charge transfer type image pick-up device in which an image pick-up portion and a transferring portion are provided separately. This device picks up an image by a two-dimensional arrangement. However, only one train arrangement is shown in FIGS. 7A to 7C. FIG. 7A shows a top plan view, with an insulating layer and electrodes being removed. FIGS. 7B and 7C show sectional views taken along the VIIB–VIIB' and VIIC–VIIC' in FIG. 7A, respectively.

An n+ type region 22, an n− type region 20 and a p+ type region 23 which are located on the leftside portion in the upper part of FIG. 7A, and the next-located n+ type region 21 in the upper part of this figure, jointly constitute a single static induction transistor type charge transfer cell. The charge transfer train is substantially the same as those shown in FIGS. 5 and 6.

As noted in FIGS. 7B and 7C, the n+ type regions 61 and 62 constitute diodes together with the p+ type substrate 25. Those electrons ionized by the incident light after passing through the light-receiving portions 51 and 52 are stored in the n+ type regions 61 and 62, respectively. After a predetermined light-receiving period of time, those electrons which have been stored in the n+ type regions 61 and 62 are transferred to the n+ type region 22. This electric charge transfer switching is carried out via an SIT-type or an FET-type switching element. By controlling the potential of the p+ type gate region 71, the electric charge is transferred into the transfer train. An n− type region 28 serves as the channel region (see FIG. 7C). In the drawing, reference numeral 80 represents an insulating material, and numerals 81 and 91 represent electrodes. The switching portion for controlling the transfer of electric charge is not limited to this example, but various modified structures can be employed.

The semiconductor material which can be used in the device of the present invention is not limited to silicon, but it may be GaAs, Ge and like semiconductor materials. By the use of such semiconductor materials, it is possible to detect the light in the near-infra and visible ranges. On the other hand, in case semiconductor materials such as HgCdTe, InSb or PbSnTe having a narrow band gap, it is possible to detect those light waves in the longer wavelength range. For example, by the use of such semiconductor material, it is possible to detect various temperature distribution or the like.

By forming a color filter on the light-receiving portion, there is formed a color image pick-up device. In case the semiconductor body employs silicon, there can be formed an excellent 3-color isolation filter by the use of alternately stacked $SiO_2$ and $Si_3N_4$ layers. For example, alternating 11 layers of $SiO_2$ and $Si_3N_4$ can provide a band rejection filter of about 90% reflection in either one of blue, green and red bands.

In the foregoing description, the structure of the controlling regions have been explained invariably, with respect to planar type junction gate region on which an insulated gate may be provided. It should be understood, however, that the controlling region may be comprised of a usual insulated-gate type, a recessed-gate type and other types.

The devices according to the present invention can be manufactured by relying on known crystal growth technique, diffusion technique, ion-implantation technique, fine processing technique and like techniques.

What is claimed is:

1. A semiconductor charge transfer device formed in a semiconductor wafer having a pair of principal surfaces, said device including at least one charge transfer train comprising a plurality of cells connected in series, each cell comprising:
    a first and second semiconductor regions of one conductivity type and of low resistivity formed adjacent to one of said principal surfaces, each of said first and second semiconductor regions having a respective potential associated therewith;
    a third semiconductor region of high resistivity having said one conductivity type and predetermined width disposed between said first and second semiconductor regions;

a fourth semiconductor region of low resistivity and having the opposite conductivity type of said one conductivity type and being disposed between said first and second semiconductor regions thereby forming a diode structure;

an insulating layer disposed on said semiconductor regions in each cell;

a first electrode formed on said insulating layer and extending from said second region of each of said cells to said fourth region of each ell for controlling the potential of said second and fourth regions;

a second electrode formed on said insulating layer and extending from said first region of each of said cells to the fourth region of the next succeeding cell for controlling the potential of said first and fourth regions;

controlling means for controllably generating a depletion region and thereby an electric field to effect a drift of charge carriers between said first and second semiconductor regions, said means for controllably generating an electric field including means responsive to a control potential applied thereto for establishing a controllable potential barrier with respect to said charge carriers having the lowest portion of a saddle-shaped region of the potential distribution in the vicinity of said first semiconductor region in accordance with both said control potential and the respective potentials associated with said first and second semiconductor regions, the distance between said first and said saddle-shaped regions being smaller than the distance between said first and said second regions;

the length of the potential barrier in the direction of carriers which have passed over this potential barrier to flow quickly by drift motion; and the portion of said insulating layer extending between said third region and said first and second electrodes being thicker than the portion of said insulating layer extending between said first, second, and fourth regions and said electrodes.

2. The semiconductor charge transfer device as recited in claim 1 wherein at most, every second cell in said charge transfer further comprises;

a light injecting window disposed on the second principal face for allowing injection of light.

* * * * *